(12) United States Patent
Shu

(10) Patent No.: US 10,031,200 B2
(45) Date of Patent: Jul. 24, 2018

(54) METHOD AND APPARATUS FOR MAGNETIC RESONANCE IMAGING

(71) Applicant: Siemens Aktiengesellschaft, Munich (DE)

(72) Inventor: Wen Fang Shu, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 720 days.

(21) Appl. No.: 14/606,179

(22) Filed: Jan. 27, 2015

(65) Prior Publication Data

US 2015/0212178 A1 Jul. 30, 2015

(30) Foreign Application Priority Data

Jan. 27, 2014 (CN) .......................... 2014 1 0039939

(51) Int. Cl.
*G01R 33/50* (2006.01)
*G01R 33/56* (2006.01)
*G01R 33/561* (2006.01)

(52) U.S. Cl.
CPC .......... *G01R 33/50* (2013.01); *G01R 33/5602* (2013.01); *G01R 33/5613* (2013.01)

(58) Field of Classification Search
CPC ................ G01R 33/50; G01R 33/5602; G01R 33/5613; G01R 33/383; G01R 33/4818
See application file for complete search history.

(56) References Cited

U.S. PATENT DOCUMENTS

| 2010/0198054 | A1 | 8/2010 | Ewing et al. |
| 2012/0078084 | A1 | 3/2012 | Piechnik et al. |
| 2012/0189183 | A1 | 7/2012 | Xue et al. |
| 2014/0128720 | A1* | 5/2014 | Gallez .................... A61B 5/055 600/411 |
| 2014/0200436 | A1* | 7/2014 | Weingartner ...... G01R 33/5602 600/413 |
| 2015/0123659 | A1* | 5/2015 | Weingartner .......... A61B 5/055 324/309 |

(Continued)

OTHER PUBLICATIONS

Deichmann et al., Fast $T_1$ Mapping on a Whole-Body Scanner, Magnetic Resonance in Medicine, vol. 42, (1999) pp. 206-209.

(Continued)

*Primary Examiner* — Clayton E Laballe
*Assistant Examiner* — Ruifeng Pu
(74) *Attorney, Agent, or Firm* — Schiff Hardin LLP

(57) ABSTRACT

In a method and apparatus for magnetic resonance imaging, an inverse recovery pulse is emitted and execution of an image acquisition sequence wherein, magnetic resonance image data are received is begun after a delayed recovery time of the inverse recovery pulse. A magnetic resonance image is reconstructed from the acquired magnetic resonance image data. The longitudinal relaxation time is obtained based on a known time after the inverse recovery pulse and a magnetization quantity of the known time. A second relaxation time is thereby able to be fully taken into account, so as to avoid a deviation of the longitudinal relaxation time. The range of application of the Look-Locker method is expanded, so that the present invention obtains an accurate longitudinal relaxation time no matter whether a delay exists before a sampled sequence.

11 Claims, 1 Drawing Sheet

(56) References Cited

U.S. PATENT DOCUMENTS

2015/0309143 A1* 10/2015 Kuhara ................. G01R 33/50
324/309

OTHER PUBLICATIONS

Messroghli et al. Modified Look-Locker Inversion Recovery (MOLLI) for High-Resolution $T_1$ Mapping of the Heart, Magnetic Resonance in Medicine vol. 52, (2004) pp. 141-146.

Deichmann et al., Quantification of $T_1$ Values by Snapshot-Flash NMR Imaging, Journal of Magnetic Resonance, vol. 96, (1992) pp. 608-612.

Gai et al., "Fast T1 Mapping Determined Using Incomplete Inversion Recovery Look-Locker 3D Balanced SSFP Acquisition and a Simple Two-Parameter Model Fit," Journal of Magnetic Resonance Imaging Pre-Print Submission (2012) pp. 1-8.

Haase, "Snapshot Flash MRI. Applications to T1, T2, and Chemical-Shift Imaging," Magnetic Resonance in Medicine, vol. 13, (1990) pp. 77-89.

* cited by examiner

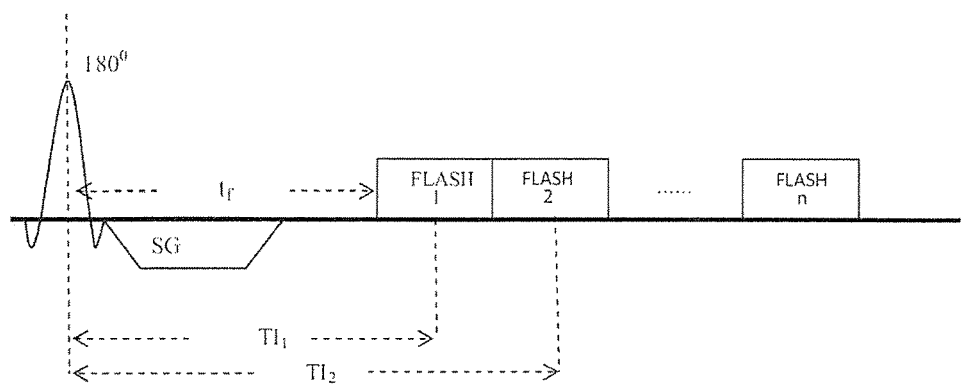

METHOD AND APPARATUS FOR MAGNETIC RESONANCE IMAGING

BACKGROUND OF THE INVENTION

Field of the Invention

The present invention relates to a method and an apparatus for magnetic resonance imaging, and in particular, to a method and apparatus for magnetic resonance imaging by use of the Look-Locker method.

Description of the Prior Art

Magnetic resonance imaging is a bio-magnetic nuclear spin imaging technology developed rapidly along with the development of computer technology, electronic circuit technology, and superconductor technology. In magnetic resonance imaging, human tissue is placed in a static magnetic field $B_0$, and then hydrogen nuclei within the human tissue are excited by a radio-frequency pulse with the same frequency as the precession frequency of the hydrogen nuclei, so as to cause resonance of the hydrogen nuclei in the tissue. The excited nuclei absorb energy and after the radio-frequency pulse ceases, the excited hydrogen nuclei emit a radio signal at a specific frequency and release the absorbed energy. This energy is detected by a receiver, and be processed by a computer to obtain an image.

In the Look-Locker method for longitudinal relaxation time imaging (T1 Mapping), a delay time ($t_f$ time) is needed between an inverse recovery pulse and an image acquisition sequence (e.g. FLASH sequence or other various sequences) in order to meet certain scanning requirements, such as a necessary spoiler gradient, a flexible inversion time (TI), and elimination of the magnetic transfer effect, and so on. In this case, the magnetization quantity proceeds through two relaxation processes: a relaxation process of a longitudinal relaxation time (T1) in the delay time, and a relaxation process of a longitudinal relaxation time (T1*) modulated by an image acquisition sequence in the image acquisition process. However, the Look-Locker method in the prior art does not take into account the relaxation process of the longitudinal relaxation time (T1).

Specifically, the Look-Locker method in the prior art is a method for measuring a longitudinal relaxation time. Immediately following the inverse recovery pulse and the delay time, longitudinal magnetization is extracted by the image acquisition sequence (e.g. a series of accelerated scramble phase gradient echo pulse sequences (Turbo FLASH Sequence)), so as to acquire a series of complete images with different inverse time in the magnetization quantity recovery process.

Because the recovery of the magnetization quantity is modulated by a radio frequency sequence of the FLASH sequence, the modulated relaxation time T1* is taken as the characterization quantity for relaxation in the process of gradually tending to be in a steady state. The relaxation process is as represented in the following equation [1].

$$M(t)=M_0^* - (M_0+M_0^*)\exp(-t/T_1^*) \qquad [1]$$

wherein $M_0^*$ is the steady-state magnetization quantity modulated by the image acquisition sequence, and $M_0^* = M_0 \cdot T_1^*/T_1$.

With regard to the longitudinal relaxation time ($T_1$), three parameters ($M_0$, $M_0^*$ and $T_1^*$) of an image may be fitted in the unit of pixel according to equation [1], where $M_0$ denotes an initial magnetization quantity, $T_1^*$ denotes a modulated relaxation time, and $M_0^*$ denotes a steady-state magnetization quantity modulated by the image acquisition sequence.

Therefore, the longitudinal relaxation time ($T_1$) is obtained directly from the fitted parameters, i.e. equation [2]:

$$T_1 = T_1^* M_0/M_0^*; \qquad [2]$$

SUMMARY OF THE INVENTION

The present invention concerns a Look-Locker method and apparatus for magnetic resonance imaging, with the object of, in the Look-Locker procedure for performing a longitudinal relaxation time imaging process (T1 Mapping), an accurate longitudinal relaxation time can be provided both in the situation where a delay time exists and in the situation where a delay time does not exist.

This object is achieved in accordance with the invention by a method that includes emitting an inverse recovery pulse delaying a recovery time of the inverse recovery pulse and then executing an image acquisition sequence and receiving magnetic resonance image data, and reconstructing a magnetic resonance image with the magnetic resonance image data, wherein a longitudinal relaxation time is obtained based on a known time after the inverse recovery pulse and a magnetization quantity of this known time.

Preferably, the longitudinal relaxation time, based on an initial magnetization quantity after the inverse recovery pulse, is obtained by a steady-state magnetization quantity being modulated by the image acquisition sequence and a longitudinal relaxation time being modulated by the image acquisition sequence comprises, with the initial magnetization quantity, the steady-state magnetization quantity modulated by the image acquisition sequence and the longitudinal relaxation time modulated by the image acquisition sequence are fitted to a first general formula, wherein the first general formula is $$M(t) = M_0^* - \left[ M_0 \left( 2e^{-\frac{t_f M_0^*}{M_0 T_1^*}} \right) + M_0^* \right] \exp(-t/T_1^*),$$

where t denotes the known time, M(t) denotes the magnetization quantity of the known time t, $t_f$ denotes the delay time, $M_0$ denotes the initial magnetization quantity, $M_0^*$ denotes the steady-state magnetization quantity modulated by the image acquisition sequence, and $T_1^*$ denotes the longitudinal relaxation time modulated by the image acquisition sequence.

Preferably, three or more groups of t and M(t) are selected to fit the initial magnetization quantity, the steady-state magnetization quantity modulated by the image acquisition sequence and the longitudinal relaxation time modulated by the image acquisition sequence according to the first general formula.

Preferably, the step of obtaining a longitudinal relaxation time based on an initial magnetization quantity after the inverse recovery pulse, a steady-state magnetization quantity modulated by an image acquisition sequence and a longitudinal relaxation time modulated by the image acquisition sequence includes fitting the initial magnetization quantity, the steady-state magnetization quantity modulated by an image acquisition sequence and the longitudinal relaxation time modulated by the image acquisition sequence according to a second general formula, wherein the second general formula is, $$M(t)=M_0^* - (mM_0+M_0^*)\exp(-t/T_1^*)$$

where t denotes the known time, M(t) denotes the magnetization quantity of the known time t, m denotes a magnetization recovery coefficient, $M_0$ denotes the initial magnetization quantity, $M_0^*$ denotes the steady-state magnetization quantity modulated by the image acquisition sequence, and $T_1^*$ denotes the longitudinal relaxation time modulated by the image acquisition sequence.

Preferably, four or more groups of t and M(t) are selected to fit the initial magnetization quantity, the steady-state magnetization quantity modulated by the image acquisition sequence and the longitudinal relaxation time modulated by the image acquisition sequence according to the second general formula.

Preferably, the step of obtaining a longitudinal relaxation time based on an initial magnetization quantity after the inverse recovery pulse, a steady-state magnetization quantity modulated by an image acquisition sequence and a longitudinal relaxation time modulated by the image acquisition sequence comprises: calculating the longitudinal relaxation time according to a third general formula, wherein the third general formula is, $$T_1 = T_1^* \cdot M_0 / M_0^*$$

where $T_1$ denotes the longitudinal relaxation time.

Preferably, the image acquisition sequence is a scramble phase gradient echo pulse sequence or an accelerated scramble phase gradient echo pulse sequence.

An apparatus for magnetic resonance imaging in accordance with the invention has a first coil unit for emitting an inverse recovery pulse, a timing unit for delaying a recovery time of the inverse recovery pulse, a second coil unit for executing an image acquisition sequence and receiving magnetic resonance image data, and a reconstruction unit for reconstructing an image of a longitudinal relaxation time with the magnetic resonance image data, wherein the reconstruction unit is further used for obtaining the longitudinal relaxation time based on a known time after the inverse recovery pulse and a magnetization quantity of the known time.

Preferably, the reconstruction unit is used for fitting the initial magnetization quantity, the steady-state magnetization quantity modulated by the image acquisition sequence and the longitudinal relaxation time modulated by the image acquisition sequence according to a first general formula, wherein the first general formula is $$M(t) = M_0^* - \left[ M_0 \left( 2 e^{-\frac{t_f M_0^*}{M_0 T_1^*}} \right) + M_0^* \right] \exp(-t/T_1^*),$$

where t denotes the known time, M(t) denotes the magnetization quantity of the known time t, $t_f$ denotes the recovery time, $M_0$ denotes the initial magnetization quantity, $M_0^*$ denotes the steady-state magnetization quantity modulated by the image acquisition sequence, and $T_1^*$ denotes the longitudinal relaxation time modulated by the image acquisition sequence.

Preferably, the reconstruction unit is used for fitting the initial magnetization quantity, the steady-state magnetization quantity modulated by the image acquisition sequence and the longitudinal relaxation time modulated by the image acquisition sequence according to a second general formula, wherein the second general formula is, $$M(t) = M_0^* - (m M_0 + M_0^*) \exp(-t/T_1^*)$$

where t denotes the known time, M(t) denotes the magnetization quantity of the known time t, m denotes a magnetization recovery coefficient, $M_0$ denotes the initial magnetization quantity, $M_0^*$ denotes the steady-state magnetization quantity modulated by the image acquisition sequence, and $T_1^*$ denotes the longitudinal relaxation time modulated by the image acquisition sequence.

Preferably, the reconstruction unit is used for calculating the longitudinal relaxation time according to a third general formula, wherein the third general formula is, $$T_1 = T_1^* \cdot M_0 / M_0^*$$

where $T_1$ denotes the longitudinal relaxation time.

It can be seen from the abovementioned solution that the advantages of the Look-Locker method for magnetic resonance imaging according to a first specific implementation and a second specific implementation lie in that: 1) the situation of a second relaxation time ($T_1$) is fully taken into account, thereby avoiding a deviation of the longitudinal relaxation time; and 2) the range of application of the Look-Locker method is expanded, so that the present invention may obtain the accurate longitudinal relaxation time $T_1$ no matter whether a delay exists before a sampled sequence.

BRIEF DESCRIPTION OF THE DRAWINGS

The single FIGURE is a time sequence schematic diagram of a Look-Locker sequence according to particular embodiments of the present invention.

DESCRIPTION OF THE PREFERRED EMBODIMENTS

In order to make the objectives, technical solutions and advantages of the present invention more apparent, the present invention will be further described in detail hereinbelow by way of embodiments.

Equation [1] describes the whole relaxation process as a relaxation process which solely takes the modulated time longitudinal relaxation time $T_1^*$ as the characterization quantity. FIG. 1 is a time sequence schematic diagram of a Look-Locker method according to particular embodiments of the present invention. In fact, immediately following the inverse pulse recovery process, there are two relaxation processes: 1) a first relaxation process, i.e. the modulated relaxation process ($T_1^*$) in the process whereby the FLASH sequence samples image signals; and 2) a second relaxation process, i.e. the longitudinal relaxation time ($T_1$) between the inverse pulse and the process whereby the FLASH sequence samples image signals (within time $t_f$).

As described earlier, the Look-Locker method in the prior art only takes into account the first relaxation process, i.e. the whole relaxation process is taken into account as a modulated relaxation process ($T_1^*$) in the process whereby the FLASH sequence samples image signals, but does not take into account the second relaxation process, i.e. the longitudinal relaxation time ($T_1$) between the inverse pulse and the process whereby the FLASH sequence samples image signals. In other words, the Look-Locker method in the prior art neglects the second relaxation time, and therefore will cause a deviation of the longitudinal relaxation time ($T_1$) that is obtained in the end, and this phenomenon is especially apparent in the situation where the longitudinal relaxation time ($T_1$) of an object under inspection is smaller or, as shown in FIG. 1, the delay time $t_f$ is longer.

In order to improve the abovementioned deviation phenomenon of the longitudinal relaxation time, the present invention provides two specific embodiments.

First Specific Embodiment

Immediately following the inverse recovery pulse, longitudinal magnetization is extracted by a series of accelerated scramble phase gradient echo pulse sequences (Turbo FLASH Sequence), so as to acquire a series of complete images with different inverse time in the magnetization recovery process.

After magnetization recovery goes through the first relaxation process (i.e. the modulated relaxation time $T_1^*$) and the second relaxation process (i.e. the longitudinal relaxation time $T_1$), the magnetization quantity will gradually reach a steady state. The second relaxation process is as shown in the following equation [3].

$$M_1 = -M_0 \cdot \left(2e^{-\frac{t_f}{T_1}} - 1\right) \quad [3]$$

where $M_1$ is a magnetization quantity in the second relaxation process, $M_0$ is an initial magnetization quantity, and $t_f$ is a delay time in the second relaxation process. Based on equation [2], i.e. $T_1 = T_1^* \cdot M_0/M_0^*$), equation [3] may be substituted into equation [1] to obtain equation [4], as below.

$$M(t) = M_0^* - \left[M_0\left(2e^{-\frac{t_f M_0^*}{M_0 T_1^*}}\right) + M_0^*\right]\exp(-t/T_1^*), \quad [4]$$

As regards the longitudinal relaxation time ($T_1$), three parameters ($M_0$, $M_0^*$ and $T_1^*$) of an image may be fitted in the unit of pixel according to equation [4], where $M_0$ denotes the initial magnetization quantity, $T_1^*$ denotes the modulated longitudinal relaxation time, and $M_0^*$ denotes the steady-state magnetization quantity modulated by the image acquisition sequence.

Specifically, the fitting process is to fit using a group of (manually set) initial values of the abovementioned three parameters ($M_0$, $M_0^*$ and $T_1^*$) and three or more groups of the above known time t and the magnetization quantity M(t) of the time t, so as to obtain a fitted value of the abovementioned three parameters ($M_0$, $M_0^*$ and $T_1^*$).

Thus, by means of the fitted value of the abovementioned three parameters ($M_0$, $M_0^*$ and $T_1^*$), the longitudinal relaxation time ($T_1$) is directly obtained from equation [2], i.e.:

$$T_1 = T_1^* \cdot M_0/M_0^* \quad [2]$$

Second Specific Embodiment

Immediately following the inverse recovery pulse, longitudinal magnetization is extracted by a series of accelerated scramble phase gradient echo pulse sequences (Turbo FLASH Sequence), so as to acquire a series of complete images with different inverse time in the magnetization recovery process.

After magnetization recovery goes through the first relaxation process (i.e. the modulated relaxation time $T_1^*$) and the second relaxation process (i.e. the longitudinal relaxation time $T_1$), the magnetization quantity will gradually reach a steady state. The second relaxation process is as shown in the following equation [6].

$$M_1 = -M_0 \cdot m \quad [6]$$

where $M_1$ denotes the magnetization quantity in the second relaxation process, $M_0$ denotes the initial magnetization quantity, and m denotes a recovery coefficient in the second relaxation process. Based on equation [2], i.e., $T_1 = T_1^* \cdot M_0/M_0^*$, equation [6] may be substituted into equation [1] to obtain equation [7], as below.

$$M(t) = M_0^* - (mM_0 + M_0^*)\exp(-t/T_1^*) \quad [7]$$

With regard to the longitudinal relaxation time ($T_1$), four parameters ($M_0$, $M_0^*$, $T_1^*$ and m) of an image may be fitted in the unit of pixel according to equation [7], where $M_0$ denotes the initial magnetization quantity, $T_1^*$ denotes the modulated longitudinal relaxation time, $M_0^*$ denotes the steady-state magnetization quantity modulated by the image acquisition sequence, and m denotes the recovery coefficient in the second relaxation process.

Specifically, the fitting process is to fit using a group of (manually set) initial values of the abovementioned four parameters ($M_0$, $M_0^*$, $T_1^*$ and m) and four or more groups of the above known time t and the magnetization quantity M(t) of the time t, so as to obtain a fitted value of the abovementioned four parameters ($M_0$, $M_0^*$, $T_1^*$ and m).

Thus, by means of the fitted value of the abovementioned four parameters ($M_0$, $M_0^*$, $T_1^*$ and m), the longitudinal relaxation time ($T_1$) is directly obtained from equation [2], i.e.:

$$T_1 = T_1^* \cdot M_0/M_0^* \quad [2]$$

The advantages of the Look-Locker method according to a first specific implementation and a second specific implementation lie in that: 1) the situation of a second relaxation time ($T_1$) is fully taken into account, thereby avoiding a deviation of the longitudinal relaxation time; and 2) the range of application of the Look-Locker method is expanded, so that the present invention may obtain the accurate longitudinal relaxation time $T_1$ no matter whether a delay exists before a sampled sequence.

Although modifications and changes may be suggested by those skilled in the art, it is the intention of the inventor to embody within the patent warranted hereon all changes and modifications as reasonably and properly come within the scope of the inventor's contribution to the art.

I claim as my invention:

1. A method for magnetic resonance imaging, comprising the steps of:
    emitting an inverse recovery pulse;
    delaying a recovery time associated with said inverse recovery pulse;
    after said delayed recovery time, starting execution of an image acquisition sequence and receiving magnetic resonance image data;
    reconstructing a magnetic resonance image with the magnetic resonance image data; and
    obtaining a longitudinal relaxation time based on a known time after the inverse recovery pulse and an initial magnetization quantity of the known time, a steady-state magnetization quantity modulated by an image acquisition sequence, and a longitudinal relaxation time modulated by the image acquisition sequence, by fitting the initial magnetization quantity, the steady-state magnetization quantity modulated by the image acquisition sequence and the longitudinal relaxation time modulated by the image acquisition sequence according to the equation:

$$M(t) = M_0^* - \left[M_0\left(2e^{-\frac{t_f M_0^*}{M_0 T_1^*}}\right) + M_0^*\right]\exp(-t/T_1^*)$$

wherein t denotes the known time, M(t) denotes the magnetization quantity of the known time t, $t_f$ denotes the delay time, $M_0$ denotes the initial magnetization quantity, $M_0^*$ denotes the steady-state magnetization quantity modulated by the image acquisition sequence, and $T_1^*$ denotes the longitudinal relaxation time modulated by the image acquisition sequence.

2. The method for magnetic resonance imaging as claimed in claim 1, comprising selecting three or more groups of t and M(t) are selected to fit the initial magnetization quantity, the steady-state magnetization quantity modulated by the image acquisition sequence and the longitudinal relaxation time modulated by the image acquisition sequence according to the equation M(t).

3. The method for magnetic resonance imaging as claimed in claim 1, comprising obtaining a longitudinal relaxation time based on an initial magnetization quantity after the inverse recovery pulse, a steady-state magnetization quantity modulated by an image acquisition sequence and a longitudinal relaxation time modulated by the image acquisition sequence comprises: calculating the longitudinal relaxation time according to:

$$T_1 = T_1^* \cdot M_0/M_0^*$$

wherein $T_1$ denotes the longitudinal relaxation time.

4. A method for magnetic resonance imaging comprising:
emitting an inverse recovery pulse;
delaying a recovery time associated with said inverse recovery pulse;
after said delayed recovery time, starting execution of an image acquisition sequence and receiving magnetic resonance image data;
reconstructing a magnetic resonance image with the magnetic resonance image data; and
obtaining a longitudinal relaxation time based on an initial magnetization quantity after the inverse recovery pulse, a steady-state magnetization quantity modulated by an image acquisition sequence and a longitudinal relaxation time modulated by the image acquisition sequence by fitting the initial magnetization quantity, the steady-state magnetization quantity modulated by the image acquisition sequence and the longitudinal relaxation time modulated by the image acquisition sequence according to the equation:

$$M(t) = M_0^* - (mM_0 + M_0^*)\exp(-t/T_1^*)$$

wherein t denotes the known time, M(t) denotes the magnetization quantity of the known time t, m denotes a particular parameter, $M_0$ denotes the initial magnetization quantity, $M_0^*$ denotes the steady-state magnetization quantity modulated by the image acquisition sequence, and $T_1^*$ denotes the longitudinal relaxation time modulated by the image acquisition sequence.

5. The method for magnetic resonance imaging as claimed in claim 4, comprising selecting four or more groups of t and M(t) are selected to fit the initial magnetization quantity, the steady-state magnetization quantity modulated by the image acquisition sequence and the longitudinal relaxation time modulated by the image acquisition sequence according to the equation for M(t).

6. The method for magnetic resonance imaging as claimed in claim 4, comprising obtaining a longitudinal relaxation time based on an initial magnetization quantity after the inverse recovery pulse, a steady-state magnetization quantity modulated by an image acquisition sequence and a longitudinal relaxation time modulated by the image acquisition sequence comprises: calculating the longitudinal relaxation time according to:

$$T_1 = T_1^* \cdot M_0/M_0^*$$

wherein $T_1$ denotes the longitudinal relaxation time.

7. The method for magnetic resonance imaging as claimed in claim 1, comprising execution of the image acquisition sequence as a scramble phase gradient echo pulse sequence or an accelerated scramble phase gradient echo pulse sequence.

8. An apparatus for magnetic resonance imaging, comprising:
a first coil unit for emitting an inverse recovery pulse;
a timing unit for delaying a recovery time associated with said inverse recovery pulse;
a second coil unit for starting execution of an image acquisition sequence, after said delayed recovery time and receiving magnetic resonance image data;
a reconstruction computer configured to reconstruct an image of a longitudinal relaxation time with the magnetic resonance image data;
the reconstruction computer being configured to obtain a longitudinal relaxation time based on a known time after the inverse recovery pulse and an initial magnetization quantity of the known time; and
the reconstruction computer is configured to fit an initial magnetization quantity, the steady-state magnetization quantity modulated by the image acquisition sequence and the longitudinal relaxation time modulated by the image acquisition sequence according to:

$$M(t) = M_0^* - \left[M_0\left(2e^{-\frac{t_f M_0^*}{M_0 T_1^*}}\right) + M_0^*\right]\exp(-t/T_1^*),$$

wherein t denotes the known time, M(t) denotes the magnetization quantity of the known time t, $t_f$ denotes the recovery time, $M_0$ denotes the initial magnetization quantity, $M_0^*$ denotes the steady-state magnetization quantity modulated by the image acquisition sequence, and $T_1^*$ denotes the longitudinal relaxation time modulated by the image acquisition sequence.

9. The apparatus for magnetic resonance imaging as claimed in claim 8, wherein the reconstruction computer is configured to calculate the longitudinal relaxation time according to:

$$T_1 = T_1^* \cdot M_0/M_0^*$$

wherein $T_1$ denotes the longitudinal relaxation time.

10. An apparatus for magnetic resonance imaging comprising:
a first coil unit for emitting an inverse recovery pulse;
a timing unit for delaying a recovery time associated with said inverse recovery pulse;
a second coil unit for starting execution of an image acquisition sequence, after said delayed recovery time and receiving magnetic resonance image data;

a reconstruction computer configured to reconstruct an image of a longitudinal relaxation time with the magnetic resonance image data;

said reconstruction computer being configured to fit the initial magnetization quantity, the steady-state magnetization quantity modulated by the image acquisition sequence and the longitudinal relaxation time modulated by the image acquisition sequence according to:

$$M(t)=M_0^*-(mM_0+M_0^*)\exp(-t/T_1^*)$$

wherein t denotes the known time, M(t) denotes the magnetization quantity of the known time t, m denotes a magnetization recovery coefficient, $M_0$ denotes the initial magnetization quantity, $M_0^*$ denotes the steady-state magnetization quantity modulated by the image acquisition sequence, and $T_1^*$ denotes the longitudinal relaxation time modulated by the image acquisition sequence.

11. The apparatus for magnetic resonance imaging as claimed in claim 10, wherein the reconstruction computer is configured to calculate the longitudinal relaxation time according to:

$$T_1=T_1^* \cdot M_0/M_0^*$$

wherein $T_1$ denotes the longitudinal relaxation time.

* * * * *